(12) United States Patent
Engelen et al.

(10) Patent No.: US 12,025,647 B2
(45) Date of Patent: Jul. 2, 2024

(54) APPARATUS AND METHOD FOR LOCATING PARTIAL DISCHARGES IN MEDIUM-VOLTAGE AND HIGH-VOLTAGE EQUIPMENT

(71) Applicant: Omicron Electronics GMBH, Klaus (AT)

(72) Inventors: Christoph Engelen, Aachen (DE); Fabian Öttl, Feldkirch (AT)

(73) Assignee: OMICRON ELECTRONICS GmbH, Klaus (AT)

( * ) Notice: Subject to any disclaimer, the term of this patent is extended or adjusted under 35 U.S.C. 154(b) by 0 days.

(21) Appl. No.: 17/820,796

(22) Filed: Aug. 18, 2022

(65) Prior Publication Data

US 2022/0390500 A1    Dec. 8, 2022

Related U.S. Application Data

(63) Continuation of application No. PCT/EP2021/053644, filed on Feb. 15, 2021.

(30) Foreign Application Priority Data

Feb. 18, 2020    (AT) .............. A 50115/2020

(51) Int. Cl.
*G01R 31/12* (2020.01)
*G01R 19/25* (2006.01)
*G01R 31/72* (2020.01)

(52) U.S. Cl.
CPC ..... *G01R 31/1227* (2013.01); *G01R 19/2503* (2013.01); *G01R 31/72* (2020.01)

(58) Field of Classification Search
USPC .......................................................... 324/551
See application file for complete search history.

(56) References Cited

U.S. PATENT DOCUMENTS

2014/0320139 A1* 10/2014 Renforth ............... G01R 31/11
324/415

FOREIGN PATENT DOCUMENTS

| | | |
|---|---|---|
| CN | 207232312 U | 4/2018 |
| EP | 1567873 A2 | 8/2005 |

(Continued)

OTHER PUBLICATIONS

Luo, Yuanlin et al., "A Review of Online Partial Discharge Measurement of Large Generators", Energies 2017, 10,1694; www.mdpi.com/journal/energies, pp. 1-32.

(Continued)

*Primary Examiner* — Farhana A Hoque
(74) *Attorney, Agent, or Firm* — Gregory L. Mayback; Mayback IP Law, P.A.

(57) ABSTRACT

An apparatus for locating partial discharges in a medium-voltage or high-voltage operating equipment comprises a signal detection device for detecting an electrical signal variable of the operating equipment, a filter device for low-pass filtering of the detected electrical signal variable dependent upon a filter cut-off frequency, a time detection device for detecting a signal propagation time of the low-pass-filtered electrical signal variable, and a comparison device for comparing the detected signal propagation time detected dependent upon the filter cut-off frequency with a reference propagation time for a charge pulse conducted through the operating equipment in order to determine a location of the partial discharge in the operating equipment dependent upon the result of the comparison. Also provided is a method for locating a partial discharge in medium-voltage or high-voltage operating equipment, in particular, using the apparatus.

15 Claims, 3 Drawing Sheets

(56) References Cited

FOREIGN PATENT DOCUMENTS

| | | |
|---|---|---|
| EP | 2360486 A1 | 8/2011 |
| JP | S5815167 A | 1/1983 |
| JP | 2013124913 A | 6/2013 |

OTHER PUBLICATIONS

International Search Report and Written opinion for Intl. Application No. PCT/EP2021/053644, dated May 28, 2021.

* cited by examiner

APPARATUS AND METHOD FOR LOCATING PARTIAL DISCHARGES IN MEDIUM-VOLTAGE AND HIGH-VOLTAGE EQUIPMENT

CROSS-REFERENCE TO RELATED APPLICATIONS

This is a continuing application, under 35 U.S.C. § 120, of copending international application No. PCT/EP2021/053644, filed Feb. 15, 2021, which designated the United States and was not published in English; this application also claims the priority, under 35 U.S.C. § 119, of Austria patent application No. A50115/2020, filed Feb. 18, 2020; the prior applications are herewith incorporated by reference in their entirety.

STATEMENT REGARDING FEDERALLY SPONSORED RESEARCH OR DEVELOPMENT

Not Applicable

FIELD OF THE INVENTION

The present systems, apparatuses, and methods relate to locating partial discharges in medium-voltage or high-voltage operating equipment. In particular, the present invention relates to such apparatuses and methods that can be used to locate partial discharges in medium-voltage or high-voltage operating equipment with complex winding structures.

BACKGROUND OF THE INVENTION

Medium-voltage or high-voltage operating equipment can fail due to short circuits if their conductor insulation is damaged. The first signs of this damage often become apparent through a partial discharge measurement. In addition to the question of whether partial discharges (PD) are active, locating the point of origin of the PD is crucial.

There are different methods for locating a PD depending on the operating device.

Electromagnetic methods, for example, scan a winding with the aid of a sensor, such as a coil with a ferrite core, and detect a PD-related voltage spike in the mV range. Furthermore, in power cables, it is possible to subject PD-related electrical pulses to a signal propagation time analysis. Other electromagnetic methods analyze PD-related radio waves.

Acoustic methods scan a winding, and, in particular, a winding head, using sound measurements. Phenomena close to the surface are easier to detect than defects in the winding. For example, acoustic signals can be triangulated in oil-filled operating equipment.

Optical methods subject a winding to a light measurement, since PDs emit not only noise but also light, which can be separated from daylight using appropriate filters. In this case, only surface phenomena are identified.

With regard to rotating electric machines, however, these methods cannot be used. The complex winding structure results in parallel propagation paths for electrical pulses, which means that a signal propagation time analysis cannot be carried out. Due to the solid insulation and the lack of accessibility to the winding, an acoustic location cannot be used either.

What the known methods have in common is that there is no assignment of the PD to the electrically measured pulse at the terminals and, therefore, no assignment to the apparent charge (cf., phase-resolved PD, PRPD). The latter would be necessary for a reliable statement as to how high-energy the partial discharge may be at its point of origin. Furthermore, the outlay in terms of sensor technology and measurement outlay increases, because a series of measurements have to be carried out to be able to determine the point of origin of the PD. Furthermore, the winding may have to be made accessible, which again significantly increases the measurement outlay.

Thus, a need exists to overcome the problems with the prior art systems, designs, and processes as discussed above.

SUMMARY OF THE INVENTION

The descriptions and drawings herein provide apparatuses and methods for locating partial discharges in medium-voltage or high-voltage operating equipment that overcome the hereinafore-mentioned disadvantages of the heretofore-known devices and methods of this general type and that provide, in particular, in operating equipment having a complex winding configuration (for example, rotating electric machines).

A first aspect of the embodiments relate to an apparatus for locating partial discharges in medium-voltage or high-voltage operating equipment. The apparatus comprises a signal detection device for detecting an electrical signal variable of the operating equipment, a filter device for low-pass filtering of the detected electrical signal variable depending on a filter cut-off frequency, a time detection device for detecting a signal propagation time of the low-pass-filtered electrical signal variable, and a comparison device for comparing the detected signal propagation time detected depending on the filter cut-off frequency with a reference propagation time for charge pulses conducted through the operating equipment in wired fashion. Based on this comparison, the location of the respective partial discharge in the operating equipment can finally be determined.

The filter device may be set up to reduce the filter cut-off frequency in increments starting from an initial filter cut-off frequency until a signal propagation time detected at the reduced filter cut-off frequency exceeds a predefined absolute signal propagation time threshold value or exceeds a signal propagation period detected at the initial filter cut-off frequency by a predefined relative signal propagation time ratio. An increment when reducing the filter cut-off frequency may be at least 0.1 kHz, preferably, 1 kHz, and, more preferably, 10 kHz. The predefined relative signal propagation time ratio may be at least 2, preferably, 5 and, particularly preferably, 10.

The filter cut-off frequency may be at most 1 MHz, preferably, at most 100 kHz, and, particularly preferably, at most 50 kHz.

The apparatus may further comprise a charge calibrator for wired conduction of a charge pulse through the operating equipment to determine the reference propagation time for this charge pulse.

The embodiments may preferably be implemented digitally. The detected electrical signal variable may accordingly include digital voltage values, and the signal detection device may include a voltmeter that provides digital voltage values. The filter device may comprise a digital low-pass filter. The time detection device may comprise a timer that provides digital time values. The comparison device may comprise an arithmetic or computation unit that provides a comparison result of the detected signal propagation time with the reference propagation time.

A second aspect relates to a method for locating partial discharges in medium-voltage or high-voltage operating equipment. The method comprises detecting an electrical signal variable of the operating equipment, low-pass filtering of the detected electrical signal variable depending on a filter cut-off frequency, detecting a signal propagation time of the low-pass-filtered electrical signal variable, and comparing the detected signal propagation time detected depending on the filter cut-off frequency with a reference propagation time for charge pulses conducted through the entire operating equipment in wired fashion.

The method may also comprise reducing the filter cut-off frequency in increments starting from an initial filter cut-off frequency until a signal propagation time detected at the reduced filter cut-off frequency exceeds a predefined absolute signal propagation time threshold value or exceeds a signal propagation period detected at the initial filter cut-off frequency by a predefined relative signal propagation time ratio.

The method may also comprise wired conducting of a charge pulse through the operating equipment or along the operating equipment to determine the reference propagation time before the location of the partial discharge.

Another aspect relates to an apparatus and a method for locating a partial discharge in medium-voltage or high-voltage operating equipment, wherein an electrical signal variable of the operating equipment is detected and a frequency range of the electrical signal variable in which a low-frequency component of the partial discharge dominates over a high-frequency component of the partial discharge is determined. A signal propagation time of the electrical signal variable is determined in the determined frequency range and compared with a reference propagation time for a charge pulse conducted through the operating equipment to determine a location of the partial discharge in the operating equipment depending on the result of the comparison.

In general, the method can be carried out in an automated or computer-aided manner using the apparatus according to one of the exemplary embodiments described herein.

With the foregoing and other objects in view, there is provided, an apparatus for locating a partial discharge in a medium-voltage or high-voltage operating equipment comprising a signal detection device configured to detect an electrical signal variable of the operating equipment, a filter device configured to low-pass filter the detected electrical signal variable depending on a filter cut-off frequency, a time detection device configured to detect a signal propagation time of the low-pass-filtered electrical signal variable, and a comparison device configured to compare the detected signal propagation time detected depending on the filter cut-off frequency with a reference propagation time for a charge pulse conducted through the operating equipment in order to determine a location of the partial discharge in the operating equipment depending on the result of the comparison.

In accordance with another feature, the filter device is set up to reduce the filter cut-off frequency in increments starting from an initial filter cut-off frequency until a signal propagation time detected at the reduced filter cut-off frequency exceeds a predefined absolute signal propagation time threshold value or exceeds a signal propagation period detected at the initial filter cut-off frequency by a predefined relative signal propagation time ratio.

In accordance with a further feature, an increment when reducing the filter cut-off frequency is at least about 10 kHz.

In accordance with an added feature, the predefined relative signal propagation time ratio is at least about 10.

In accordance with an additional feature, the filter cut-off frequency is at most about 1 MHz.

In accordance with yet another feature, the filter cut-off frequency is at most about 100 kHz.

In accordance with yet a further feature, the filter cut-off frequency is at most about 50 kHz.

In accordance with yet an added feature, there is provided a charge calibrator for wired conduction of a charge pulse through the operating equipment to determine the reference propagation time.

In accordance with yet an additional feature, the electrical signal variable detected comprises digital voltage values and the signal detection device comprises a voltmeter configured to provide digital voltage values.

In accordance with again another feature, the filter device comprises a digital low-pass filter.

In accordance with again a further feature, the time detection device comprises a timer configured to provide digital time values.

In accordance with again an added feature, the comparison device comprises an arithmetic unit configured to provide a comparison result of the detected signal propagation time with the reference propagation time.

With the objects in view, there is also provided a method for locating a partial discharge in a medium-voltage or high-voltage operating equipment including the steps of detecting an electrical signal variable of the operating equipment, low-pass filtering the detected electrical signal variable depending on a filter cut-off frequency, detecting a signal propagation time of the low-pass-filtered electrical signal variable and comparing the detected signal propagation time detected depending on the filter cut-off frequency with a reference propagation time for a charge pulse conducted through the operating equipment to determine a location of the partial discharge in the operating equipment depending on the result of the comparison.

With the objects in view, there is also provided a method for locating a partial discharge in a medium-voltage or high-voltage operating equipment including the steps of detecting an electrical signal variable of the operating equipment, determining a frequency range of the electrical signal variable in which a low-frequency component of the partial discharge dominates over a high-frequency component of the partial discharge, detecting a signal propagation time of the electrical signal variable in the determined frequency range, and comparing the detected signal propagation time with a reference propagation time for a charge pulse conducted through the operating equipment in order to determine a location of the partial discharge in the operating equipment depending on the result of the comparison.

In accordance with again an additional mode, there is provided the step of reducing the filter cut-off frequency in increments starting from an initial filter cut-off frequency until a signal propagation time detected at the reduced filter cut-off frequency exceeds a predefined absolute signal propagation time threshold value or exceeds a signal propagation period detected at the initial filter cut-off frequency by a predefined relative signal propagation time ratio.

In accordance with still another mode, there is provided the step of wired conducting of a charge pulse through the operating equipment to determine the reference propagation time based upon a running time of the charge pulse through the operating equipment before the location of the partial discharge.

In accordance with still a further mode, the method is carried out using the above apparatus.

In accordance with a concomitant mode, the method further comprises the step of low-pass filtering the detected electrical signal variable depending on a filter cut-off frequency, wherein the step of detecting the signal propagation time comprises detecting the signal propagation time of the low-pass-filtered electrical signal variable and the step of comparing the detected signal propagation time with the reference propagation time comprises comparing the detected signal propagation time detected depending on the filter cut-off frequency with the reference propagation time for the charge pulse conducted through the operating equipment in order to determine the location of the partial discharge in the operating equipment depending on the result of the comparison.

Although the systems, apparatuses, and methods are illustrated and described herein as embodied in apparatuses and methods for locating partial discharges in medium-voltage or high-voltage operating equipment, it is, nevertheless, not intended to be limited to the details shown because various modifications and structural changes may be made therein without departing from the spirit of the invention and within the scope and range of equivalents of the claims. Additionally, well-known elements of exemplary embodiments will not be described in detail or will be omitted so as not to obscure the relevant details of the systems, apparatuses, and methods.

Additional advantages and other features characteristic of the systems, apparatuses, and methods will be set forth in the detailed description that follows and may be apparent from the detailed description or may be learned by practice of exemplary embodiments. Still other advantages of the systems, apparatuses, and methods may be realized by any of the instrumentalities, methods, or combinations particularly pointed out in the claims.

Other features that are considered as characteristic for the systems, apparatuses, and methods are set forth in the appended claims. As required, detailed embodiments of the systems, apparatuses, and methods are disclosed herein; however, it is to be understood that the disclosed embodiments are merely exemplary of the systems, apparatuses, and methods, which can be embodied in various forms. Therefore, specific structural and functional details disclosed herein are not to be interpreted as limiting, but merely as a basis for the claims and as a representative basis for teaching one of ordinary skill in the art to variously employ the systems, apparatuses, and methods in virtually any appropriately detailed structure. Further, the terms and phrases used herein are not intended to be limiting; but rather, to provide an understandable description of the systems, apparatuses, and methods. While the specification concludes with claims defining the systems, apparatuses, and methods of the invention that are regarded as novel, it is believed that the systems, apparatuses, and methods will be better understood from a consideration of the following description in conjunction with the drawing figures, in which like reference numerals are carried forward.

BRIEF DESCRIPTION OF THE DRAWINGS

The accompanying figures, where like reference numerals refer to identical or functionally similar elements throughout the separate views, which are not true to scale, and which, together with the detailed description below, are incorporated in and form part of the specification, serve to illustrate further various embodiments and to explain various principles and advantages all in accordance with the systems, apparatuses, and methods. Advantages of embodiments of the systems, apparatuses, and methods will be apparent from the following detailed description of the exemplary embodiments thereof, which description should be considered in conjunction with the accompanying drawings in which the same reference signs denote the same or similar elements.

DETAILED DESCRIPTION OF THE EMBODIMENTS

Figure 1:
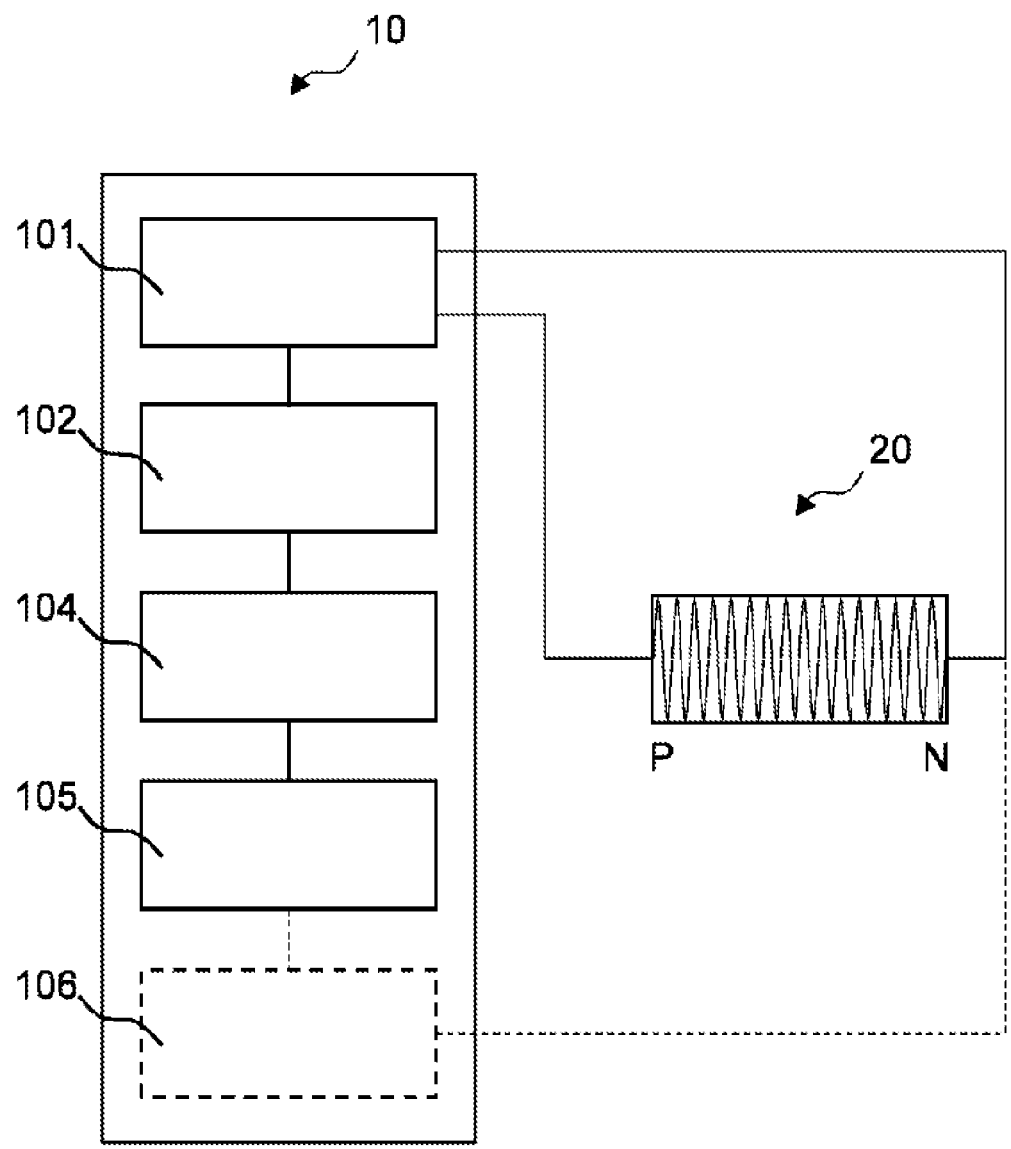
FIG. 1 is a block diagram of an exemplary embodiment of an apparatus for locating partial discharges in medium-voltage or high-voltage operating equipment.

As required, detailed embodiments of the systems, apparatuses, and methods are disclosed herein; however, it is to be understood that the disclosed embodiments are merely exemplary of the systems, apparatuses, and methods, which can be embodied in various forms. Therefore, specific structural and functional details disclosed herein are not to be interpreted as limiting, but merely as a basis for the claims and as a representative basis for teaching one skilled in the art to variously employ the systems, apparatuses, and methods in virtually any appropriately detailed structure. Further, the terms and phrases used herein are not intended to be limiting; but rather, to provide an understandable description of the systems, apparatuses, and methods. While the specification concludes with claims defining the features of the systems, apparatuses, and methods that are regarded as novel, it is believed that the systems, apparatuses, and methods will be better understood from a consideration of the following description in conjunction with the drawing figures, in which like reference numerals are carried forward.

In the following detailed description, reference is made to the accompanying drawings which form a part hereof, and in which are shown by way of illustration embodiments that may be practiced. It is to be understood that other embodiments may be utilized and structural or logical changes may be made without departing from the scope. Therefore, the following detailed description is not to be taken in a limiting sense, and the scope of embodiments is defined by the appended claims and their equivalents.

Alternate embodiments may be devised without departing from the spirit or the scope of the invention. Additionally, well-known elements of exemplary embodiments of the systems, apparatuses, and methods will not be described in detail or will be omitted so as not to obscure the relevant details of the systems, apparatuses, and methods.

Before the systems, apparatuses, and methods are disclosed and described, it is to be understood that the terminology used herein is for the purpose of describing particular embodiments only and is not intended to be limiting. The terms "comprises," "comprising," or any other variation thereof are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element. The terms "including" and/or "having," as used herein, are defined as comprising (i.e., open language). The terms "a" or "an", as used herein, are defined as one or more than one. The term "plurality," as used herein, is defined as two or more than two. The term "another," as used herein, is defined as at least a second or more. The description may use the terms "embodiment" or "embodiments," which may each refer to one or more of the same or different embodiments.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact (e.g., directly coupled). However, "coupled" may also mean that two or more elements are not in direct contact with each other, but yet still cooperate or interact with each other (e.g., indirectly coupled).

For the purposes of the description, a phrase in the form "A/B" or in the form "A and/or B" or in the form "at least one of A and B" means (A), (B), or (A and B), where A and B are variables indicating a particular object or attribute. When used, this phrase is intended to and is hereby defined as a choice of A or B or both A and B, which is similar to the phrase "and/or". Where more than two variables are present in such a phrase, this phrase is hereby defined as including only one of the variables, any one of the variables, any combination of any of the variables, and all of the variables, for example, a phrase in the form "at least one of A, B, and C" means (A), (B), (C), (A and B), (A and C), (B and C), or (A, B and C).

Relational terms such as first and second, top and bottom, and the like may be used solely to distinguish one entity or action from another entity or action without necessarily requiring or implying any actual such relationship or order between such entities or actions. The description may use perspective-based descriptions such as up/down, back/front, top/bottom, and proximal/distal. Such descriptions are merely used to facilitate the discussion and are not intended to restrict the application of disclosed embodiments. Various operations may be described as multiple discrete operations in turn, in a manner that may be helpful in understanding embodiments; however, the order of description should not be construed to imply that these operations are order dependent.

As used herein, the term "about" or "approximately" applies to all numeric values, whether or not explicitly indicated. These terms generally refer to a range of numbers that one of skill in the art would consider equivalent to the recited values (i.e., having the same function or result). In many instances these terms may include numbers that are rounded to the nearest significant figure. As used herein, the terms "substantial" and "substantially" means, when comparing various parts to one another, that the parts being compared are equal to or are so close enough in dimension that one skill in the art would consider the same. Substantial and substantially, as used herein, are not limited to a single dimension and specifically include a range of values for those parts being compared. The range of values, both above and below (e.g., "+/−" or greater/lesser or larger/smaller), includes a variance that one skilled in the art would know to be a reasonable tolerance for the parts mentioned.

Herein various embodiments of the systems, apparatuses, and methods are described. In many of the different embodiments, features are similar. Therefore, to avoid redundancy, repetitive description of these similar features may not be made in some circumstances. It shall be understood, however, that description of a first-appearing feature applies to the later described similar feature and each respective description, therefore, is to be incorporated therein without such repetition.

Described now are exemplary embodiments. A description of exemplary embodiments in specific fields of application does not imply any restriction to these fields of application. Elements of schematic representations are not necessarily true to scale, but rather so that their function and purpose can be understood by those skilled in the art. Unless expressly stated otherwise, the features of the various embodiments are able to be combined with one another.

Referring now to the figures of the drawings in detail and first, particularly to FIG. 1, there is shown a first exemplary embodiment of an apparatus 10 for locating partial discharges in medium-voltage or high-voltage operating equipment 20.

A medium-voltage or high-voltage operating equipment within the context of this application can be understood to mean operating equipment that are able to be used at the voltage levels of the high-voltage network or the medium-voltage network. In particular, these may have complex winding structures. Examples of this include rotating electric machines, power transformers and voltage converters, for instance. The devices and methods can also be used for machines in industrial applications.

A partial discharge or pre-discharge within the context of this application can be understood to mean locally occurring, imperfect electrical breakdowns in the insulation of conductor structures in medium-voltage or high-voltage operating equipment, especially when exposed to AC voltages.

The apparatus 10 shown on the left-hand side in FIG. 1 comprises a signal detection device 101 that detects 301 an electrical signal variable of the operating equipment 20 shown on the right-hand side in FIG. 1. As illustrated in FIG. 1, the connections of the operating equipment 20 that lead out of the operating equipment 20 and are labeled "P(hase)" and "N(eutral)" can be electrically conductively connected to the signal detection device 101.

An electrical signal variable within the context of this application can be understood to mean an electrical current intensity or, in particular, an electrical voltage (potential difference).

The signal detection device 101 may comprise a voltmeter that provides digital voltage values, and the detected electrical signal variable can, consequently, include digital voltage values.

This significantly simplifies circuit complexity and subsequent signal processing.

The apparatus 10 further comprises a filter device 102 that low-pass filters 302 the detected electrical signal variable depending on a filter cut-off frequency $f_C$.

A filter cut-off frequency or breaking frequency in the context of this application can be understood to mean those frequencies at which an amplitude response of a filtered electrical signal variable decreases to a value of $1/(\sqrt{2}) \approx 70.7\%$.

An amplitude response in the context of this application can be understood to mean a frequency-dependent ratio between the amplitudes of an input variable and an output variable of a linear, time-invariant system, in particular, a filter, with sinusoidal excitation.

Signal propagation of PD-related electromagnetic signals/pulses is dependent on the frequency of said signals/pulses. In this case, the signals can be transmitted through the insulation (high-frequency) or in a wired manner through the copper tracks (low-frequency). High-frequency components are, therefore, radiated, are not wired and arrive at the signal detection device 101 via the shortest route. Low-frequency components, on the other hand, are wired and follow the winding geometry.

Figure 2:
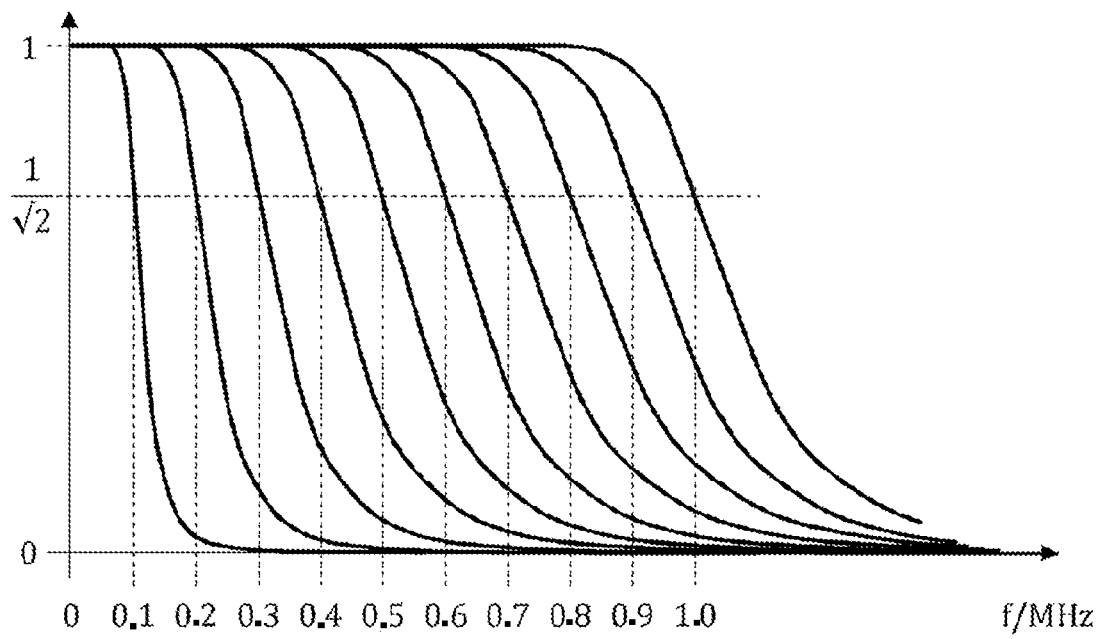
FIG. 2 is a graph illustrating dependency of an amplitude response of a filter device for low-pass filtering of a detected electrical signal variable on a filter cut-off frequency.

FIG. 2 is a graph illustrating a dependency of an amplitude response of a filter device 102 for low-pass filtering 302 of a detected electrical signal variable on a filter cut-off frequency $f_C$.

The low-pass filtering 302 removes the high-frequency components, as illustrated in FIG. 2 by way of example. The amplitude response of the same filter device 102 at ten different filter cut-off frequencies $f_C$ from about 0.1 MHz to about 1 Mhz is shown. In a respective passband, the amplitude response of the filtered electrical signal variable is above the value of $1/(\sqrt{2}) \approx 70.7\%$ that characterizes the respective filter cut-off frequency $f_C$, and in a stopband below.

An incremental reduction 303 of the filter cut-off frequency $f_C$ has the consequence that the passband is gradually reduced at lower frequencies and the stopband is gradually increased at higher frequencies.

Figure 3:
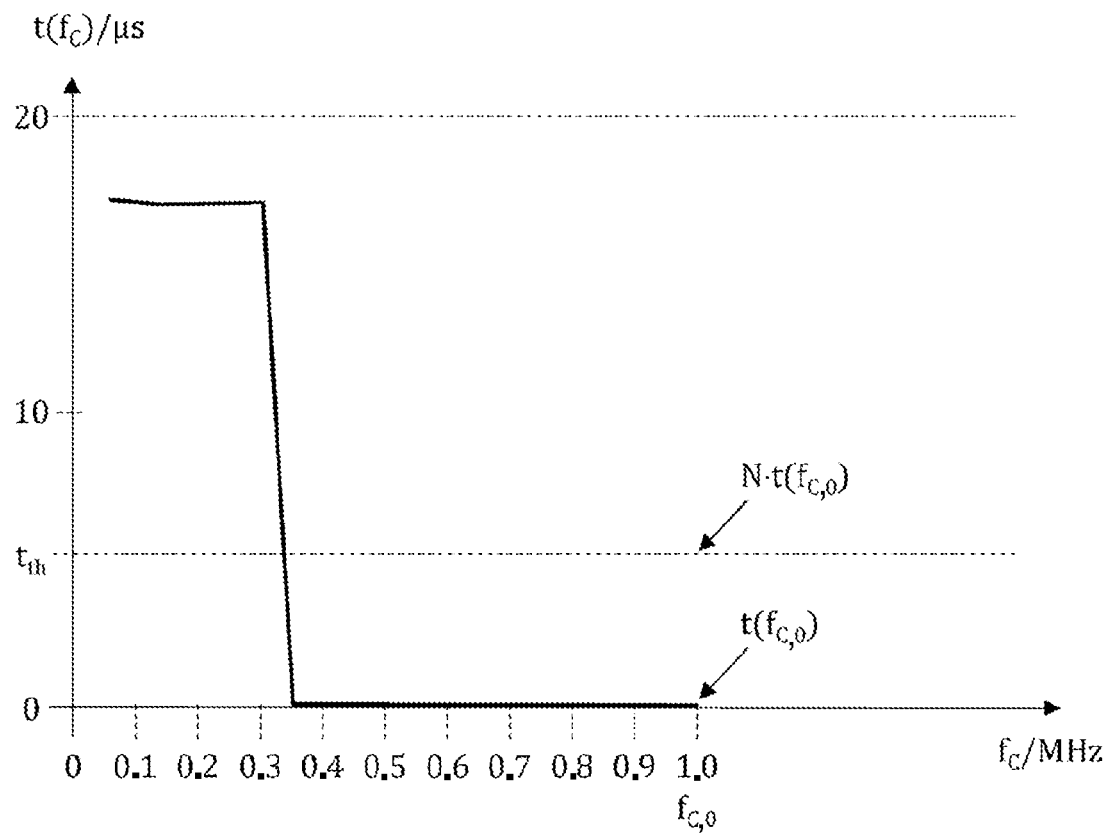
FIG. 3 is a graph illustrating a dependency of a signal propagation time of a partial discharge in the operating equipment on the filter cut-off frequency.

FIG. 3 illustrates a dependency of a signal propagation time $t(f_C)$ on the filter cut-off frequency $f_C$. Shown is the exemplary signal propagation time $t(f_C)$ of a PD-induced electromagnetic pulse up to the signal detection device 101 depending on a filter cut-off frequency $f_C$ that is successively reduced 303 from about 1 MHz to about 0.1 MHz.

Depending on the filter cut-off frequency $f_C$, the high-frequency component of the signal can initially dominate, as illustrated in FIG. 3 by way of example. This component propagates by radiation and arrives at the signal detection device 101 via the shortest path.

The filter device 102 can be set up to reduce 303 the filter cut-off frequency $f_C$ in increments starting from an initial filter cut-off frequency $f_{C,0}$ until a signal propagation time t detected at the reduced filter cut-off frequency $f_C$ exceeds a predefined absolute signal propagation time threshold value $t_{th}$ or exceeds a signal propagation period to detected at the initial filter cut-off frequency $f_{C,0}$ by a predefined relative signal propagation time ratio N.

When incrementally reducing 303 the filter cut-off frequency $f_C$, there is a sudden increase in the signal propagation time t at around 0.35 MHz. This jump is considered to be a transition at which the low-frequency, wired component of the detected electrical signal variable dominates, and varies depending on the test object and has been observed in particular in the range <1 MHz. The incremental reduction 303 can also be extended into the lower MHz range (for example, <10 kHz). The most significant results are obtained at filter frequencies of <100 kHz, even better 10-50 kHz.

With knowledge of the filter cut-off frequency $f_C$ of a test object at which a low-frequency, wired signal propagation dominates, this can be set or configured directly without requiring an incremental reduction 303 of the filter cut-off frequency $f_C$ in the field. With the incremental reduction 303 of the filter cut-off frequency $f_C$, data management for test object-specific filter cut-off frequencies $f_C$ becomes superfluous and the test process is automated.

The multipath propagation of the signals through the insulation is eliminated by the low-pass filtering 302, as a result of which a propagation time analysis can then be carried out, as is known from power cables. With knowledge of the winding geometry and the total propagation time through the winding, conclusions can be drawn about the origin of the PD.

The filter device 102 may comprise, in particular, a digital low-pass filter.

This considerably simplifies the circuit complexity and the subsequent signal processing, in particular with regard to the adjustability of the filter cut-off frequency $f_C$.

The apparatus 10 further comprises a time detection device 104 that detects 304 a signal propagation time t of the low-pass-filtered electrical signal variable.

The time detection device 103 may comprise a timer that provides digital time values.

This considerably simplifies the circuit complexity and the subsequent signal processing, in particular, with regard to possibly required storage and processing of a number of signal propagation periods for a corresponding number of different filter cut-off frequencies $f_C$.

The apparatus 10 also comprises a comparison device 105 that compares 305 the detected signal propagation time $t(f_C)$ detected depending on the filter cut-off frequency $f_C$ with a reference propagation time $t_{ref}$ for charge pulses conducted in a wired manner through the entire operating equipment 20.

The comparison device 105 may comprise an arithmetic unit that provides a comparison result of the detected signal propagation time t with the reference propagation time $t_{ref}$.

The reference propagation time $t_{ref}$ for charge pulses conducted in a wired manner through the entire operating equipment 20 can be detected, for example, during production or before start-up of the operating equipment 20 with the aid of a charge calibrator 106 (see below). In this case, an artificially generated charge pulse is conducted through the entire operating equipment 20. The reference propagation time $t_{ref}$ thus determined corresponds to a total length L of the wired signal propagation path between the terminals of the operating equipment 20. A partial discharge in the operating equipment 20 occurs between these terminals. The wired signal propagation time $t(f_C)$ detected depending on the filter cut-off frequency $f_C$ is always a fraction of the reference propagation time $t_{ref}$ and corresponds to an equal fraction of the length I of the entire signal propagation path:

$$\frac{x}{L} = \frac{t(fc)}{t_{ref}}$$

By comparing 305 the two signal propagation times, partial discharges in a winding of the operating equipment 20 can, thus, be located at a length position x between the terminals of the operating equipment 20 without having direct access to the relevant winding of the operating equipment 20 because the underlying measurements can be taken at the terminals of the operating equipment 20. With additional knowledge of the complex winding geometry of the operating equipment 20, an exact spatial localization of the point of origin of the PD can also be carried out.

The device 10 can also include a charge calibrator 106 that conductively conducts 306 a charge pulse through the entire operating equipment 20.

Prior to the actual PD measurement, and, therefore, indicated as optional in FIG. 1 by dashed lines, an artificially generated PD pulse can be sent through the entire winding using a charge calibrator 106. For this purpose, the charge calibrator 106 is to be connected in an electrically conductive manner to the remote "N(eutral)" terminal of the operating equipment 20. The charge pulse released there by the charge calibrator 106 propagates from the remote "N(eutral)" terminal through the entire winding provided between the terminals of the operating equipment 20 to the "P(hase)" connection close to the signal detection device 101 and after a propagation time $t_{ref}$ leads to a change in the electrical signal variable recorded 301 there. The propagation time $t_{ref}$ of this pulse serves as a reference for the propagation time that a pulse needs to run through the entire winding (total propagation time). The propagation time t of a real PD pulse is given relative to this reference to indicate the relative position of the point of origin of the PD within the winding. Of course, the charge calibrator 106 can alternatively also be connected to the "P(hase)" terminal, while the signal detection then takes place via the "N(eutral)" terminal.

Figure 4:
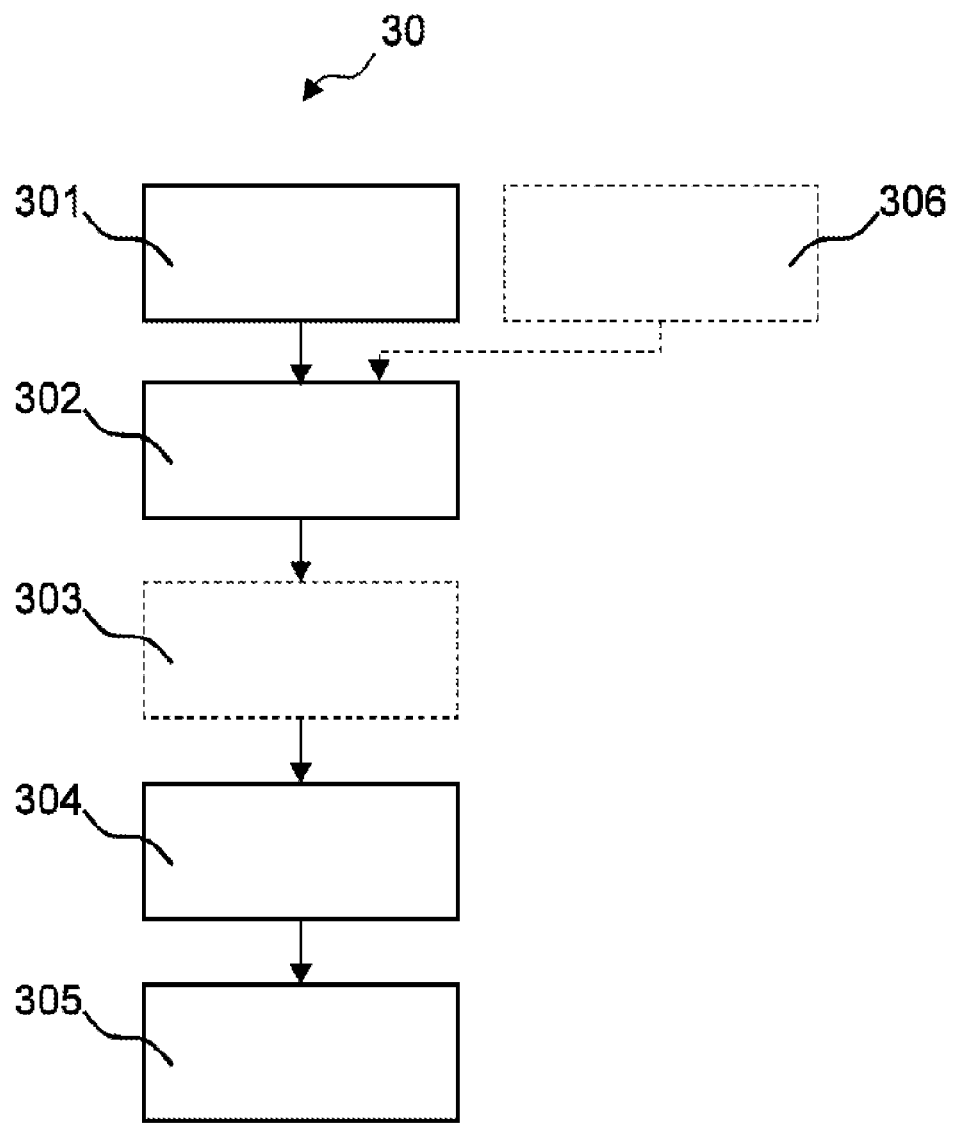
FIG. 4 is a diagram illustrating an exemplary embodiment of a method for locating partial discharges in medium-voltage or high-voltage operating equipment.

FIG. 4 illustrates a method 30 for locating partial discharges in medium-voltage or high-voltage operating equipment 20 according to an exemplary embodiment.

The method 30 can be carried out using the apparatus 10 according to various exemplary embodiments.

Consequently, the apparatus features mentioned above and their advantages can be used analogously in the method.

For this purpose, the signal detection device 101 of the apparatus 10 as shown in FIG. 1 can be electrically conductively connected to the close and remote terminals of the operating equipment 20.

In step 301, the method 30 comprises detecting an electrical signal variable of the operating equipment 20 using the signal detection device 101 of the apparatus 10.

In step 302, the method 30 comprises low-pass filtering of the detected electrical signal variable using a filter device 102 of the apparatus 10 depending on a filter cut-off frequency $f_C$ of the filter device 102.

The filter cut-off frequency $f_C$ may be at most about 1 MHz, preferably, at most about 100 kHz, and, particularly preferably, at most about 50 kHz.

In step 303, the method 30 can also comprise reducing the filter cut-off frequency $f_C$ in increments starting from an initial filter cut-off frequency $f_{C,0}$ until a signal propagation time t detected at the reduced filter cut-off frequency $f_C$ exceeds a predefined absolute signal propagation time threshold value $t_{th}$ or exceeds a signal propagation period t0 detected at the initial filter cut-off frequency $f_{C,0}$ by a predefined relative signal propagation time ratio N.

$$t(f_C) > t_{th} \text{ or } t(f_C) > N \cdot t(f_{C,0})$$

An increment when reducing 303 the filter cut-off frequency fC may be at least about 0.1 kHz, preferably, about 1 kHz, and, more preferably, about 10 kHz.

This limits the duration of a PD examination of a test object.

The predefined relative signal propagation time ratio N may be at least 2, preferably, 5 and, particularly preferably, 10.

In addition or as an alternative, this enables a threshold value to be defined relative to detecting a sudden increase in the signal propagation time t when reducing 303 the filter cut-off frequency $f_C$ in increments.

In step 304, the method 30 comprises detecting a signal propagation time t of the low-pass-filtered electrical signal variable using a time detection device 104 of the apparatus 10.

In step 305, the method 30 also comprises comparing the detected signal propagation time t detected depending on the filter cut-off frequency $f_C$ with a reference propagation time $t_{ref}$ for charge pulses conducted in a wired manner through the entire operating equipment 20 by a comparison device 105.

In step 306, the method 30 can also comprise wired conduction of a charge pulse through the entire operating equipment 20 by a charge calibrator 106 of the apparatus 10, with step 306 being indicated in FIG. 4 and the charge calibrator 106 in FIG. 1 being indicated as optional by way of dashed lines. The charge calibrator 106 can be electrically conductively connected to the remote terminal of the operating equipment 20 to introduce an artificially generated PD pulse there and a reference propagation time $t_{ref}$ based thereon charge pulses conducted in a wired manner through the entire operating equipment 20.

It is noted that various individual features of the inventive processes and systems may be described only in one exemplary embodiment herein. The particular choice for description herein with regard to a single exemplary embodiment is not to be taken as a limitation that the particular feature is only applicable to the embodiment in which it is described. All features described herein are equally applicable to, additive, or interchangeable with any or all of the other exemplary embodiments described herein and in any combination or grouping or arrangement. In particular, use of a single reference numeral herein to illustrate, define, or describe a particular feature does not mean that the feature cannot be associated or equated to another feature in another drawing figure or description. Further, where two or more reference numerals are used in the figures or in the drawings, this should not be construed as being limited to only those embodiments or features, they are equally applicable to similar features or not a reference numeral is used or another reference numeral is omitted.

The foregoing description and accompanying drawings illustrate the principles, exemplary embodiments, and modes of operation of the systems, apparatuses, and methods. However, the systems, apparatuses, and methods should not be construed as being limited to the particular embodiments discussed above. Additional variations of the embodiments discussed above will be appreciated by those skilled in the art and the above-described embodiments should be regarded as illustrative rather than restrictive. Accordingly, it should be appreciated that variations to those embodiments can be made by those skilled in the art without departing from the scope of the systems, apparatuses, and methods as defined by the following claims.

What is claimed is:

1. An apparatus for locating a partial discharge in a medium-voltage or high-voltage operating equipment, comprising:
    a signal detection device configured to detect an electrical signal variable of the operating equipment;
    a filter device configured to low-pass filter the detected electrical signal variable depending on a filter cut-off frequency;
    a time detection device configured to detect a signal propagation time of the low-pass-filtered electrical signal variable; and
    a comparison device configured to compare the detected signal propagation time detected depending on the filter cut-off frequency with a reference propagation time for a charge pulse conducted through the operating equipment in order to determine a location of the partial discharge in the operating equipment depending on the result of the comparison, the filter device being set up to reduce the filter cut-off frequency in increments starting from an initial filter cut-off frequency until a signal propagation time detected at the reduced filter cut-off frequency:
   exceeds a predefined absolute signal propagation time threshold value; or
   exceeds a signal propagation period detected at the initial filter cut-off frequency by a predefined relative signal propagation time ratio.

2. The apparatus according to claim 1, wherein an increment when reducing the filter cut-off frequency is at least 10 kHz.

3. The apparatus according to claim 1, wherein the predefined relative signal propagation time ratio is at least 10.

4. The apparatus according to claim 1, wherein the filter cut-off frequency is at most 1 MHz.

5. The apparatus according to claim 1, wherein the filter cut-off frequency is at most 100 kHz.

6. The apparatus according to claim 1, wherein the filter cut-off frequency is at most 50 kHz.

7. The apparatus according to claim 1, further comprising a charge calibrator for wired conduction of a charge pulse through the operating equipment to determine the reference propagation time.

8. The apparatus according to claim 1, wherein:
   the electrical signal variable detected comprises digital voltage values; and
   the signal detection device comprises a voltmeter configured to provide digital voltage values.

9. The apparatus according to claim 1, wherein the filter device comprises a digital low-pass filter.

10. The apparatus according to claim 1, wherein the time detection device comprises a timer configured to provide digital time values.

11. The apparatus according to claim 1, wherein the comparison device comprises an arithmetic unit configured to provide a comparison result of the detected signal propagation time with the reference propagation time.

12. A method for locating a partial discharge in a medium-voltage or high-voltage operating equipment, comprising the steps of:
   detecting an electrical signal variable of the operating equipment;
   low-pass filtering the detected electrical signal variable depending on a filter cut-off frequency;
   detecting a signal propagation time of the low-pass-filtered electrical signal variable;
   comparing the detected signal propagation time detected depending on the filter cut-off frequency with a reference propagation time for a charge pulse conducted through the operating equipment to determine a location of the partial discharge in the operating equipment depending on the result of the comparison; and
   reducing the filter cut-off frequency in increments starting from an initial filter cut-off frequency until a signal propagation time detected at the reduced filter cut-off frequency:
      exceeds a predefined absolute signal propagation time threshold value; or
      exceeds a signal propagation period detected at the initial filter cut-off frequency by a predefined relative signal propagation time ratio.

13. The method according to claim 12, further comprising the step of wired conducting of a charge pulse through the operating equipment to determine the reference propagation time based upon a running time of the charge pulse through the operating equipment before the location of the partial discharge.

14. The method according to claim 12, wherein the method is carried out using the apparatus according to claim 1.

15. A method for locating a partial discharge in a medium-voltage or high-voltage operating equipment, comprising the steps of:
   detecting an electrical signal variable of the operating equipment;
   low-pass filtering the detected electrical signal variable depending on a filter cut-off frequency;
   determining a frequency range of the electrical signal variable in which a low-frequency component of the partial discharge dominates over a high-frequency component of the partial discharge;
   detecting a signal propagation time of the low-pass-filtered electrical signal variable in the determined frequency range; and
   comparing the detected signal propagation time detected depending on the filter cut-off frequency with a reference propagation time for a charge pulse conducted through the operating equipment in order to determine a location of the partial discharge in the operating equipment depending on the result of the comparison.

* * * * *